(12) United States Patent
Wataru et al.

(10) Patent No.: US 10,889,201 B2
(45) Date of Patent: Jan. 12, 2021

(54) POWER REDUNDANCY SYSTEM

(71) Applicant: Yazaki Corporation, Tokyo (JP)

(72) Inventors: Kazuhisa Wataru, Makinohara (JP); Kenji Kazumi, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 40 days.

(21) Appl. No.: 16/294,079

(22) Filed: Mar. 6, 2019

(65) Prior Publication Data
US 2019/0334375 A1    Oct. 31, 2019

(30) Foreign Application Priority Data

Apr. 27, 2018   (JP) .................................. 2018-086961

(51) Int. Cl.
*B60L 58/20*   (2019.01)
*G01R 31/36*   (2020.01)
(Continued)

(52) U.S. Cl.
CPC ............ *B60L 58/20* (2019.02); *B60L 3/0046* (2013.01); *B60L 3/0069* (2013.01); *B60L 3/0092* (2013.01); *B60L 3/04* (2013.01); *B60L 58/18* (2019.02); *G01R 31/36* (2013.01); *H02J 1/082* (2020.01); *H02J 1/10* (2013.01); *H02J 9/061* (2013.01); *B60L 2210/10* (2013.01); *H02J 2310/40* (2020.01); *Y02T 10/70* (2013.01); *Y02T 10/72* (2013.01)

(58) Field of Classification Search
CPC .... B60L 3/0046; B60L 2210/10; B60L 58/20; B60L 3/0069; B60L 3/04; B60L 58/18; H02J 2310/46; H02J 1/082; H02J 2310/40; H02J 2310/48; Y02T 10/7005; Y02T 10/7066; Y02T 10/7216
See application file for complete search history.

(56) References Cited

U.S. PATENT DOCUMENTS 9,871,480 B2 *   1/2018   Toyora ...................... B60L 3/04
9,950,630 B2 *   4/2018   Date ......................... B60L 53/55
(Continued)

FOREIGN PATENT DOCUMENTS

JP   2017-229132 A   12/2017
JP   2018-68039 A    4/2018
WO   2006/136380 A1  12/2006

*Primary Examiner* — Ryan Johnson
(74) *Attorney, Agent, or Firm* — Sughrue Mion, PLLC

(57) ABSTRACT

Provide is a power supply redundant system in which power supply systems of different voltages coexist, which allows electric power to be supplied to a load even if a ground fault or short circuit occurs therein. The system includes a DCDC converter, a first side of the DCDC convertor being connected to a first battery having a first voltage, a first switch provided between a second battery having a second voltage different from the first voltage and a second side of the DCDC converter, a load operating with the second voltage, separately connected to the second battery and the second side of the DCDC converter, and a controller monitoring a voltage of the second battery by turning on the first switch, and when the voltage of the second battery becomes equal to or lower than a first reference value, switching off the first switch and allowing the DCDC converter to output the second voltage from the second side.

7 Claims, 7 Drawing Sheets

(51) Int. Cl.
*H02J 9/06* (2006.01)
*B60L 3/00* (2019.01)
*H02J 1/10* (2006.01)
*H02J 1/08* (2006.01)
*B60L 58/18* (2019.01)
*B60L 3/04* (2006.01)

(56) References Cited

U.S. PATENT DOCUMENTS

2009/0261796 A1* 10/2009 Ito .................... H02M 3/1582
 323/285
2015/0352968 A1 12/2015 Date et al.
2018/0334037 A1* 11/2018 Masui .................. B60L 3/0069
2020/0122600 A1* 4/2020 Yamamoto ............. B60L 58/10

* cited by examiner

POWER REDUNDANCY SYSTEM

BACKGROUND OF THE INVENTION

Field of the Invention

The present invention relates to a power supply redundant system in which power supply systems of different voltages coexist.

Description of the Related Art conventionally, as a power supply system of a car, a 12 V power supply system was common, but recently, a 48 V power supply system has been actively adopted. Adopting higher voltage power supply than before allows for reduction of a supply current even with the same output. As a result, reduction of car weight is expected due to reduction of power loss at the time of power transmission and an electric wire becoming thinner. The 48 V power supply system is expected to be used in vehicles equipped with automatic driving systems in the future.

Even in the case of adopting the 48 V power supply system, for the time being, it can be expected to coexist with a 12 V power supply system inside the vehicle for operating existing electrical equipment etc. Coexisting with the 12 V power supply system and the 48 V power supply system allows for construction of a power supply redundant system intended to make power supply redundant.

PRIOR ART DOCUMENT

[Patent Document 1] Japanese Patent Application Laid-Open No. 2017-229132

SUMMARY OF THE INVENTION

FIG. 7 is a block diagram illustrating an automobile power supply redundancy system 300 in which a 12 V power system and a 48 V power system coexist. As shown in the figure, the 12 V power supply system includes a 12 V load 320, and a 12 V battery 310 powers the 12 V load 320. A 48 V power supply system has a 48 V load 340 and the 48 V battery 330 powers the 48 V load 340. Further equipped with ISG (generator with motor function) etc., power may be supplied to the 48 V load 340 therethrough.

A DCDC converter 350 is provided between the 12 V power supply system and the 48 V power supply system, and intends to make the power supply redundant by mutually exchanging power. In the normal state, to step down 48 V to 12 V operates, allowing supplying power to the 12 V power system from the 48 V power supply system.

The 48 V load 340 relates to a function such as steering, and it is possible to separate a load desired to be powered when an abnormality occurs in the 48 V battery 330 (hereinafter referred to as "backup load") and other loads (hereinafter referred to as "general loads").

The power supply redundancy system 300 shown in FIG. 7 allows the DCDC converter 350 to perform the step-up operation even when a voltage drop or an abnormality such as open occurs in the 48V battery 330, supplying power from the 12 V power supply system to the 48 V backup load.

However, when a ground fault or a short circuit occurs in the 48 V battery 330, even if supplying power is attempted from the 12 V power supply system via the DCDC convertor 350, the voltage does not rise sufficiently in the power supply system. Therefore, it may be impossible to supply necessary electric power to the 48 V backup load from the 12 V power supply system.

Accordingly, the present invention aims at providing a power supply redundancy system in which power supply systems of different voltages coexist, which allows for supplying electric power to the load even when a ground fault or short circuit occurs in one power supply system.

In order to solve the above problem, a power supply redundancy system according to one embodiment of the present invention includes: a DCDC converter, a first side of the DCDC convertor being connected to a first battery having a first voltage; a first switch provided between a second battery having a second voltage different from the first voltage and a second side of the DCDC converter; a load operating with the second voltage, separately connected to the second battery and the second side of the DCDC converter; and a controller monitoring a voltage of the second battery by turning on the first switch, and when the voltage of the second battery becomes equal to or lower than a first reference value, switching off the first switch and allowing the DCDC converter to output the second voltage from the second side.

Here, preferably, a capacitor is connected to a side of the load to which the second side of the DCDC converter is connected.

Preferably, a second switch is provided between the load and the second side of the DCDC converter, and the controller turns on the second switch when monitoring the voltage of the second battery, and when the voltage of the second battery becomes a predetermined value or less, switches off the second switch, and monitors a voltage on the second side of the DCDC converter, and when the voltage of the second side of the DCDC converter becomes a second reference value or more, switches on the second switch.

At this time, the second switch may be constituted by a semiconductor switch, and a cathode of the parasitic diode may be disposed on a side of the load.

According to the present invention, in a power supply redundancy system in which power supply systems of different voltages coexist, electric power can be supplied to the load even when a ground fault or a short circuit occurs in one of the power supply systems.

DETAILED DESCRIPTION OF THE PREFERRED EMBODIMENTS

Figure 1:
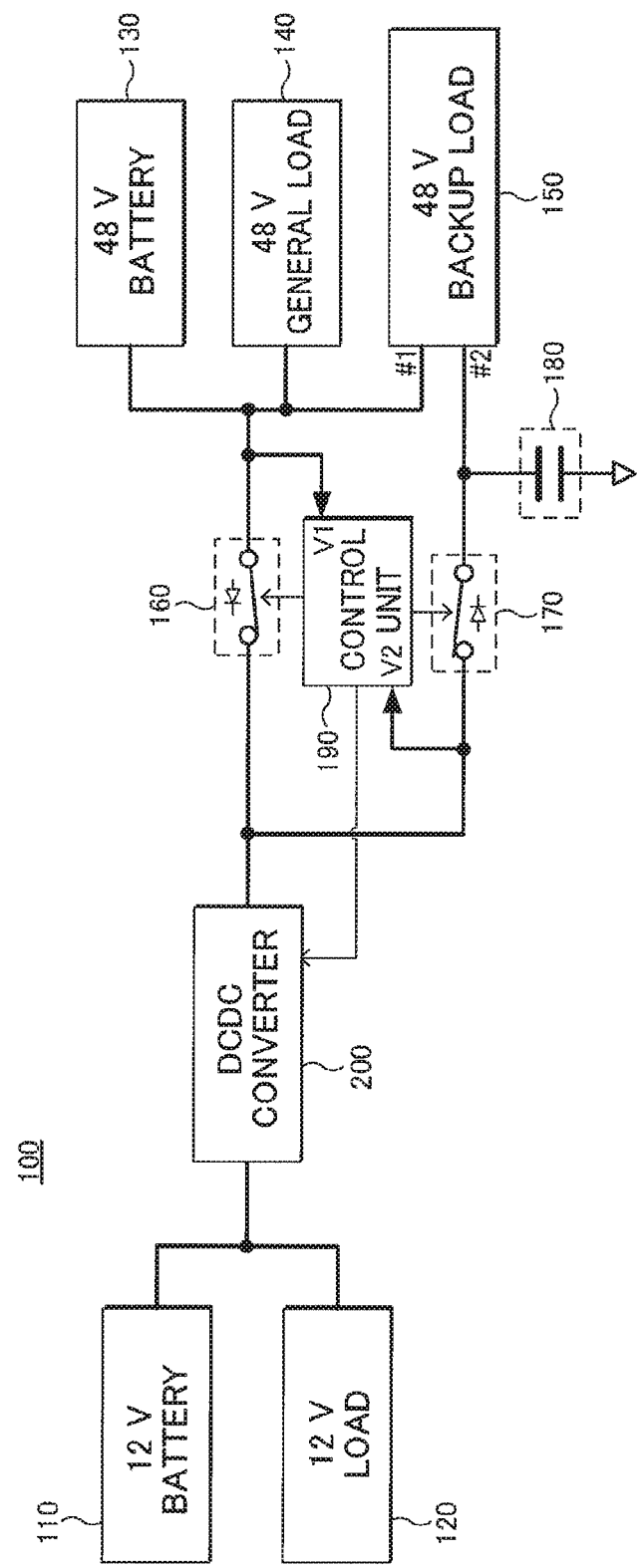
FIG. 1 is a block diagram showing a configuration of a power supply redundancy system according to the present embodiment.

Embodiments of the present invention will be described in detail with reference to the drawings. FIG. 1 is a block diagram showing a configuration of a power supply redundant system 100 according to the present embodiment. As shown in the figure, the power redundancy system 100 includes both of a 12 V power supply system and a 48 V power supply system. A DCDC converter 200 is installed between 12 V power supply system and 48 V power supply system, which intends to make the power supply redundant by mutual power exchange.

The 12 V power supply system has a 12 V load 120 and a 12 V battery 110 supplies power to a 12 V load. The 48 V power supply system includes a 48 V general load 140 and a 48 V backup load 150, and a 48 V battery 130 supplies power to the 48 V general load 140 and 48 V backup load 150. In addition, ISG (a generator with motor function) and the like are provided, and power is supplied to the 48 V general load 140 and the 48 V backup load 150.

Here, the 48 V backup load 150, which relates to functions such as steering, is a load desirable to be maintained with power supply even when an abnormality occurs in the 48 V battery 130 or the like. The 48 V general load 140 is a 48 V load other than that. As 48 V backup load 150, EPS (Electric Power Steering) or the like is taken, for example.

The power supply redundancy system 100 according to the present embodiment includes a first switch 160, a second switch 170, a capacitor 180, and a control unit 190, in order to supply power to the 48 V backup load 150 even when a ground fault or a short circuit occurs in the 48 V battery 130.

The first switch 160 is provided between the 48 V side of the DCDC converter 200 and the 48 V battery 130. The second switch 170 is provided between the 48 V side of the DCDC converter 200 and the 48 V backup load 150.

Here, the 48 V backup load 150 has an input #1 and an input #2, and the input #1 is connected to the 48 V battery 130, the input #2 is connected to the second switch 170.

The first switch 160 and the second switch 170 are arranged when constituted with semiconductor switches, such that a cathode of the parasitic diode of the switch 160 is on the DCDC converter 200 side, and a cathode of the parasitic diode of the second switch 170 is on the 48 V backup load 150 side.

Capacitor 180 is provided at the input #2 of the 48V backup load 150 for preventing instantaneous interruption at an occurrence of abnormality of the 48 V battery 130. For this reason, capacitive aluminum electrolytic capacitors and the like are suitable. If the instantaneous interruption is acceptable at the 48V backup load 150, the capacitor 180 and the second switch 170 may be omitted.

The control unit 190 monitors a voltage V1 of the 48 V battery 130 and a voltage V2 on the 48 V side of the DCDC converter 200, and turns on and off the first switch 160 and the second switch 170, and controls an operation of the DCDC converter 200. The control unit 190 is constituted by an apparatus such as an IC. The control unit 190 may be configured by distributing functions with a plurality of devices.

Figure 2:
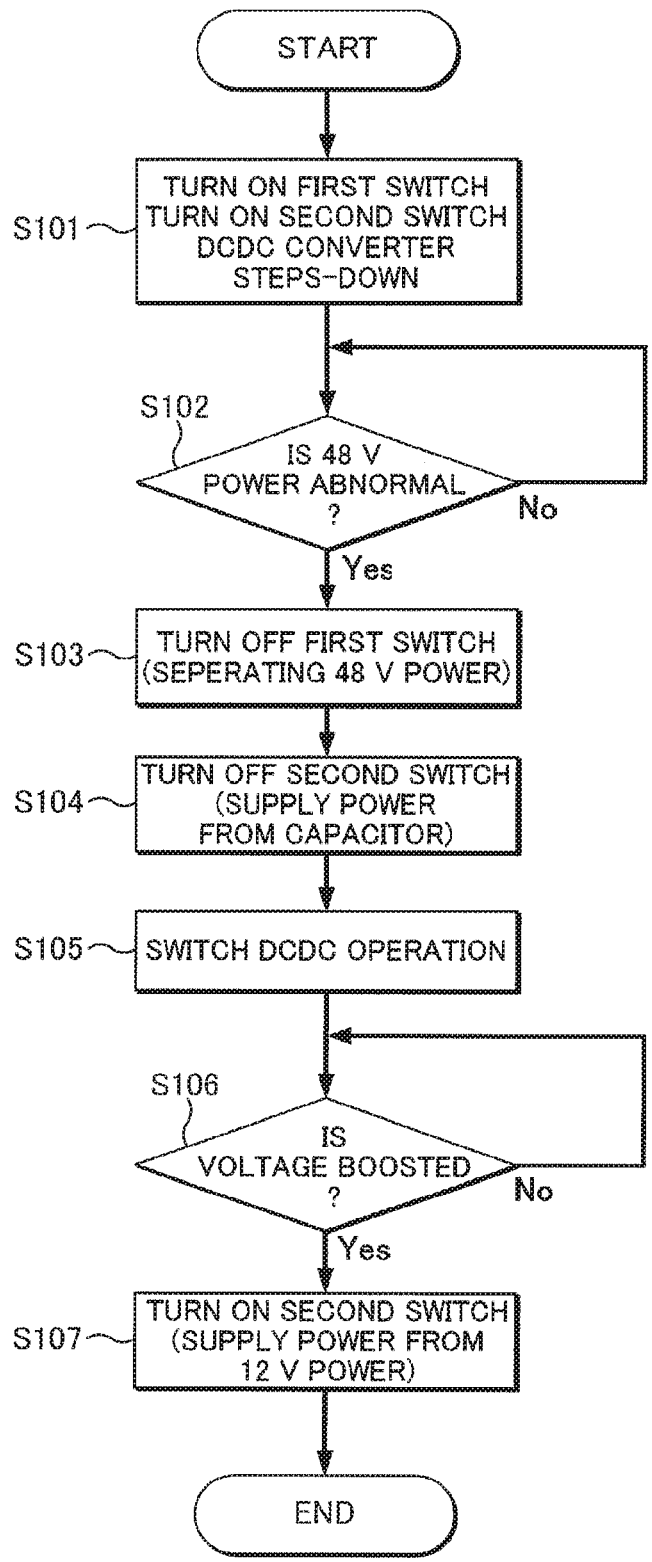
FIG. 2 is a flowchart describing an operation of the power supply redundant system.

Next, an operation of the power redundancy system 100 having the above configuration will be described with reference to the flowchart of FIG. 2. In a normal state, the first switch 160 and the second switch 170 are a state of being turned on, the DCDC converter 200 performs an operation of stepping down 48 V to 12 V, and supplies electric power from the 48 V power supply system to the 12 V power supply system (S 101).

Figure 3:
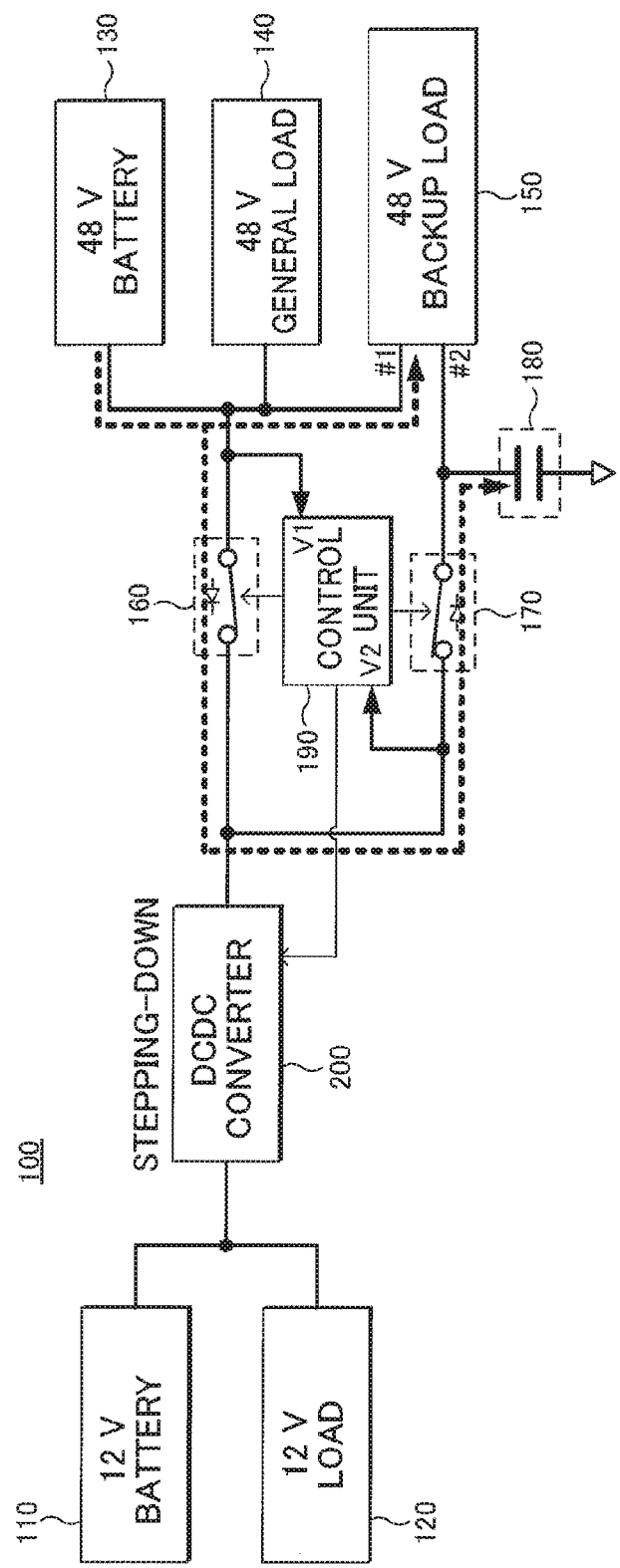
FIG. 3 is a diagram showing a power supply path in a normal state.

At this time, as shown in FIG. 3, the 48 V battery 130 supplies power to the 48V backup load 150, and charges the capacitor 180 through the first switch 160 and the second switch 170.

The control unit 190 monitors the voltage V1 of the 48 V battery 130, and when detecting the voltage V1 deteriorating equal to or less than a predetermined value, determines that an abnormality has occurred in the 48V battery 130 (S102: Yes). As abnormality of 48 V battery 130 included are battery open, output voltage low, ground fault, short circuit, and the like.

When determining that an abnormality has occurred in the 48 V battery 130, the control unit 190 turns off the first switch 160 (S103). As a result, the 48 V battery 130 is separated from the converter DCDC 200.

Figure 4:
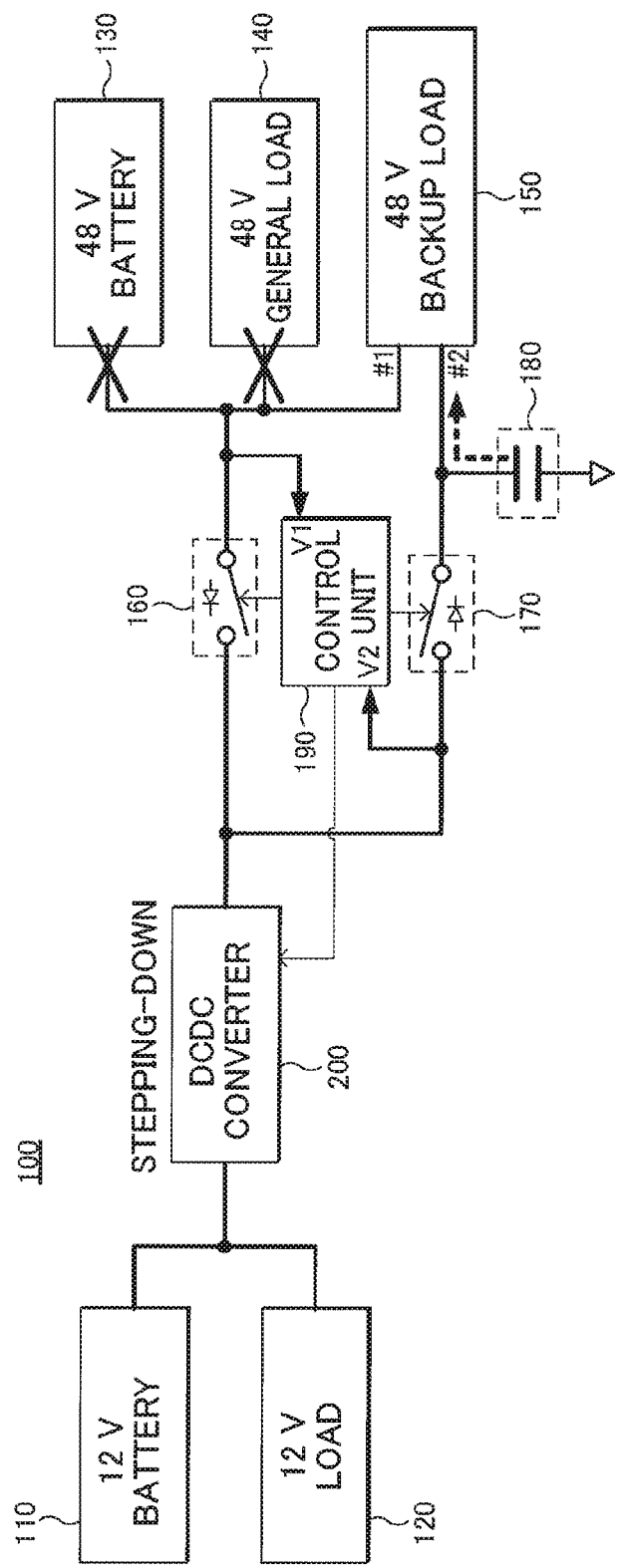
FIG. 4 is a diagram showing the power supply path immediately after an abnormality occurs in a 48 V battery.

Further, the second switch 170 is switched off (S104). In this state, as shown in FIG. 4, the 48 V backup load 150 is powered by capacitor 180, therefore, the instantaneous interruption of the 48V backup load 150 can be prevented.

Figure 5:
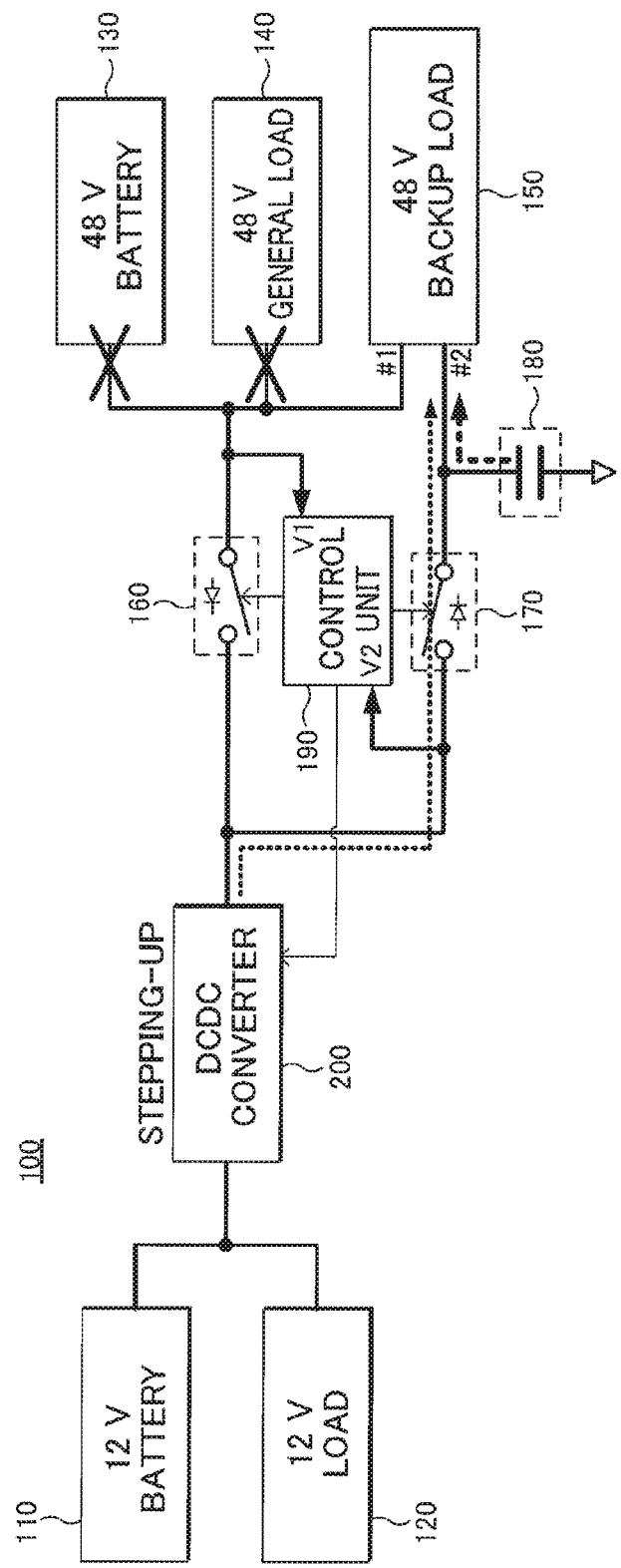
FIG. 5 is a view showing the power supply path when a DCDC converter is switched to a boost operation.

Further, the control unit 190 switches the DCDC converter 200, which has been performing the step-down operation, to a boosting operation from 12 V to 48 V (S105). In a state a boost voltage immediately after switching does not reach 48 V, the second switch 170 is off, but as shown in FIG. 5, power can be supplementarily supplied to the backup load 150 from the DCDC converter 200 by the parasitic diode of the second switch 170.

The control unit 190 monitors the output voltage V2 of the DC-DC converter 200, and when detecting the output voltage V2 rising up to near 48 V (S 105: Yes), the second switch 170 is turned on (S106).

Figure 6:
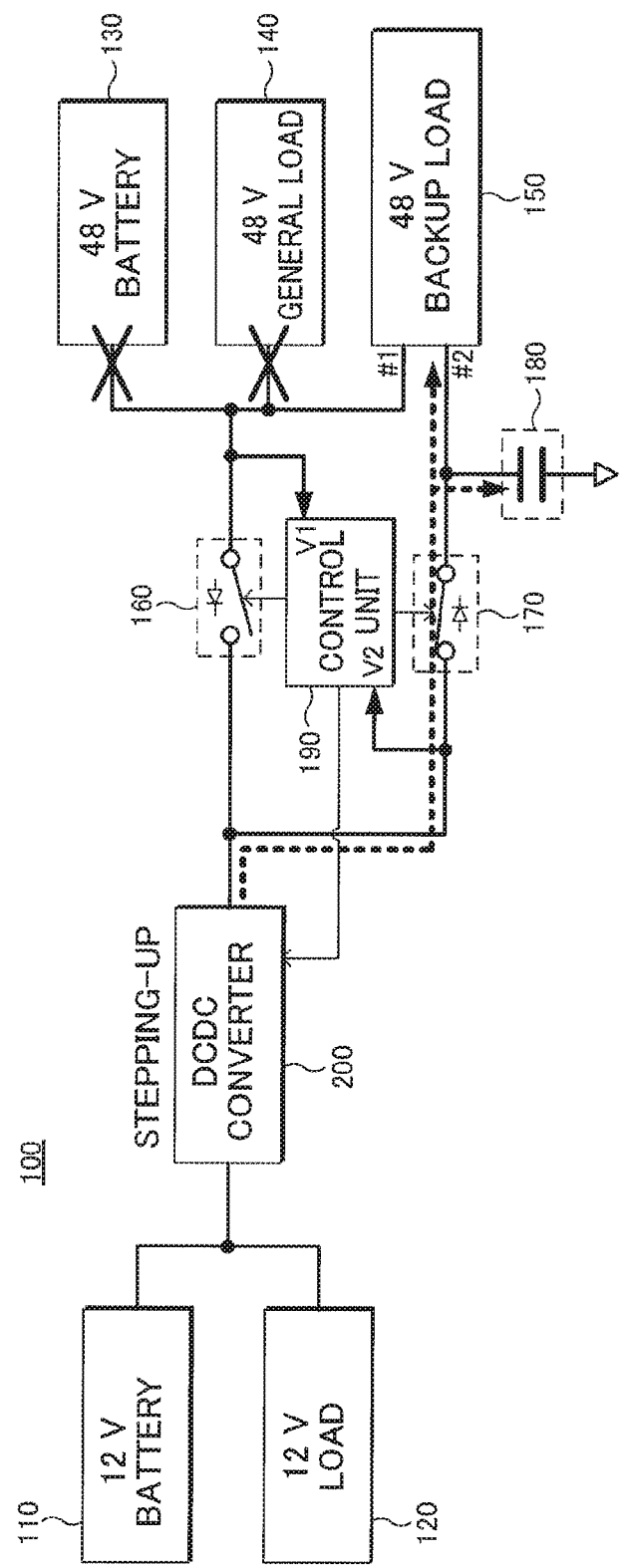
FIG. 6 is a diagram showing the power supply path after an output voltage of the DCDC converter rises.
Figure 7:
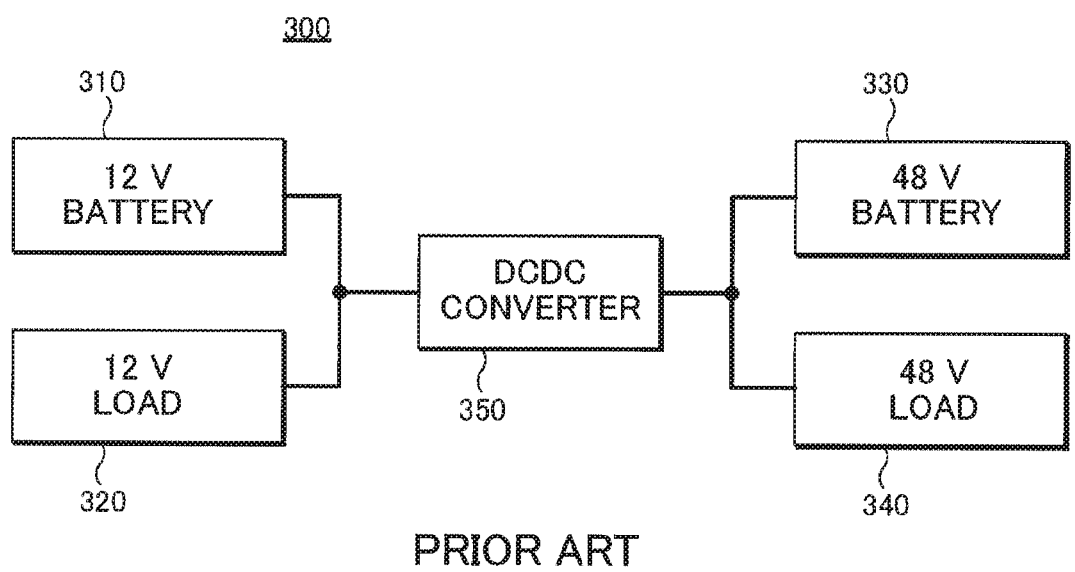
FIG. 7 is a block diagram showing a redundant system showing the power supply of a vehicle in which a 12 V power supply system and a 48 V power supply system coexist.

At this time, even when a ground fault or a short circuit occurs in the 48 V battery 130, power can be supplied from the 12 V power supply system to the 48 V backup load 150 through the DCDC converter 200. This is because the 48 V battery 130 is separated by the first switch 160. Also, the capacitor 180 is charged. FIG. 6 indicates the power path when the power is supplied from the 12 V power supply system to the 48 V backup load 150.

As described above, according to the power supply redundancy system 100 of the present embodiment, power is supplied to the 48 V backup load 150 even when a ground fault or short circuit occurs in the 48 V battery 130.

The coexisting power system is not limited to 12 V and 48 V. Also, 48V backup load 150 is not limited to the steering function such as the EPS, but may be a traveling function, a door opening/closing function, automatic driving functions, and the like, for various functions. Also, the 48 V power system, for example, may be divided into a plurality of blocks such as a front side and a rear side.

REFERENCE SIGNS LIST 100 power supply redundant system
110 12 V battery
120 12 V load
130 48 V battery
140 48 V general load
150 48 V backup load
160 first switch
170 second switch
180 capacitor
190 control unit
200 DCDC converter

What is claimed is:
1. A power supply redundancy system, comprising:
  a DCDC converter, a first side of the DCDC converter being connected to a first battery having a first voltage;
  a first switch provided between a second battery having a second voltage different from the first voltage and a second side of the DCDC converter;

a load operating with the second voltage, and having at least two power input terminals one of which is connected to the second battery and another of which is connected to the second side of the DCDC converter; and a controller monitoring a voltage of the second battery by turning on the first switch, and when the voltage of the second battery becomes equal to or lower than a first reference value, switching off the first switch and allowing the DCDC converter to output the second voltage from the second side.

2. The power supply redundancy system according to claim 1, wherein a capacitor is connected to a side of the load to which the second side of the DCDC converter is connected.

3. The power supply redundancy system according to claim 1, wherein a second switch is provided between the load and the second side of the DCDC converter, and wherein the controller turns on the second switch when monitoring the voltage of the second battery, and when the voltage of the second battery becomes a predetermined value or less, switches off the second switch, and monitors a voltage on the second side of the DCDC converter, and when the voltage of the second side of the DCDC converter becomes a second reference value or more, switches on the second switch.

4. The power supply redundancy system according to claim 2, wherein a second switch is provided between the load and the second side of the DCDC converter, and wherein the controller turns on the second switch when monitoring the voltage of the second battery, and when the voltage of the second battery becomes a predetermined value or less, switches off the second switch, and monitors a voltage on the second side of the DCDC converter, and when the voltage of the second side of the DCDC converter becomes a second reference value or more, switches on the second switch.

5. The power supply redundancy system according to claim 3, wherein the second switch is constituted by a semiconductor switch, and a cathode of the parasitic diode is disposed on a side of the load.

6. The power supply redundancy system according to claim 4, wherein the second switch is constituted by a semiconductor switch, and a cathode of the parasitic diode is disposed on a side of the load.

7. A power supply redundancy system, comprising:

a DCDC converter, a first side of the DCDC converter being connected to a first battery having a first voltage;

a first switch provided between a second battery having a second voltage different from the first voltage and a second side of the DCDC converter;

a load operating with the second voltage separately connected to the second battery and the second side of the DCDC converter; and a controller monitoring a voltage of the second battery by turning on the first switch, and when the voltage of the second battery becomes equal to or lower than a first reference value, switching off the first switch and allowing the DCDC converter to output the second voltage from the second side, wherein a second switch is provided between the load and the second side of the DCDC converter, and wherein the controller turns on the second switch when monitoring the voltage of the second battery, and when the voltage of the second battery becomes a predetermined value or less, switches off the second switch, and monitors a voltage on the second side of the DCDC converter, and when the voltage of the second side of the DCDC converter becomes a second reference value or more, switches on the second switch.

* * * * *